(12) United States Patent  (10) Patent No.: US 7,821,036 B2
Ehara  (45) Date of Patent: Oct. 26, 2010

(54) SEMICONDUCTOR DEVICE AND METHOD FOR MANUFACTURING THE SAME

(75) Inventor: Toshihiro Ehara, Saitama (JP)

(73) Assignee: Sanken Electric Co., Ltd., Saitama (JP)

( * ) Notice: Subject to any disclaimer, the term of this patent is extended or adjusted under 35 U.S.C. 154(b) by 226 days.

(21) Appl. No.: 11/953,655

(22) Filed: Dec. 10, 2007

(65) Prior Publication Data
US 2008/0284022 A1    Nov. 20, 2008

(30) Foreign Application Priority Data
Dec. 12, 2006    (JP) .............................. 2006-335085

(51) Int. Cl.
H01L 21/338    (2006.01)
H01L 21/336    (2006.01)

(52) U.S. Cl. .................. 257/195; 257/192; 257/194; 257/347; 257/E21.445; 257/E21.453; 257/E29.255; 438/151; 438/167; 438/172; 438/197; 438/570

(58) Field of Classification Search .................. 257/192, 257/194, 195, 347, E21.445, E21.463, E29.255; 438/151, 167, 172, 197, 570
See application file for complete search history.

(56) References Cited

U.S. PATENT DOCUMENTS

| | | | |
|---|---|---|---|
| 6,867,078 B1 * | 3/2005 | Green et al. .................. 438/167 |
| 7,524,709 B2 * | 4/2009 | Ishikawa et al. ............. 438/151 |
| 7,645,655 B2 * | 1/2010 | Watanabe et al. ............ 438/197 |
| 2001/0019879 A1 * | 9/2001 | Kravtchenko et al. ....... 438/570 |
| 2009/0093116 A1 * | 4/2009 | Wu ............................. 438/653 |

FOREIGN PATENT DOCUMENTS

JP    09-008407    1/2007

* cited by examiner

Primary Examiner—Dao H Nguyen
(74) Attorney, Agent, or Firm—Howard & Howard Attorneys PLLC

(57) ABSTRACT

A semiconductor device (10) comprises a substrate (11), a semiconductor layer (12), an insulation film (13), a protective film (15), a source electrode (21), a drain electrode (22), a gate electrode (23). The semiconductor device (10) comprises a protective film (15) formed so as to cover at least an upper surface of the insulation film (13). This enables preventing aluminum contained in the source electrode (21) and the drain electrode (22) from reacting with material contained in the insulation film (13). Accordingly, the increase of the resistance of the electrode and the increase of current collapse are prevented. Accordingly, the semiconductor device (10) has a satisfactory electric performance characteristics.

9 Claims, 5 Drawing Sheets

SEMICONDUCTOR DEVICE AND METHOD FOR MANUFACTURING THE SAME

RELATED APPLICATIONS

This application claims priority to Japanese Patent Application No. 2006-335085 filed on Dec. 12, 2006 and incorporated herein by reference in its entirety.

BACKGROUND OF THE INVENTION

1. Field of the Invention

The present invention relates to semiconductor devices utilizing nitride-based compound semiconductor and a method for manufacturing the same.

2. Description of the Related Art

A wide variety of nitride-based compound semiconductor layers are currently available. Semiconductor layers having AlGaN/GaN hetero-structure and layers having AlGaN/AlN/GaN hetero-structure are examples of those layers. To form an ohmic electrode that comes in ohmic contact with those heterostructure semiconductor layer, titanium and aluminum may be used as the material of the electrode. This is described in e.g. Unexamined Japanese Patent Application KOKAI Publication No. H09-008407. Titanium and aluminum have a work function similar to those of the nitride-based compounds.

Manufacturing processes of these semiconductor devices of this kind are, for example, as follows: Initially a semiconductor layer composed of nitride-based compound is formed. Then on the semiconductor layer, an insulation film is deposited. This insulation film is composed of, e.g. $SiO_2$ and/or SiN. Next, of this insulation film, a part on which to build a electrode is removed by photo lithography or other means, thereby exposing the part of the surface of the semiconductor layer. This is in other words forming an opening on the insulation film. Then, a metal film is formed both on the insulation film and on the above-described exposed part of the semiconductor layer exposed via the opening. Subsequently, a heat processing is performed to react the silicon contained in the semiconductor layer with a metal contained in the metal film. This forms a metal alloy electrode.

Most heat treatments for alloying a semiconductor layer, mainly composed of silicon, with a metal film are performed at a temperature of 550 degree. C. or the lower. This heat treatment is performed at a temperature in the range from 440 degree. C. to 550 degree. C. for, for example, 10 to 30 minutes. On the other hand, a higher temperature is required for alloying a semiconductor layer mainly composed of nitride-based compound with a metal film, as compared to the heat treatment for alloying the semiconductor layer composed mainly of silicon with a metal film. Such a heat treatment for alloying the semiconductor layer mainly composed of nitride-based compound requires, specifically, a temperature equal to or higher than 550 degree. C.: for example, a temperature in the range from 550 degree. C. to 850 degree. C.

The metal film is formed also on the insulation film formed on the semiconductor layer. That is, in a certain part the metal film is in contact with the insulation film. This causes a reaction between the metal contained in the metal film and silicon, etc. contained in the insulation film in the heat treatment. The reaction generates a reaction product e.g. AlSi, AlSiO, and $Al_2O_3$, etc. This reaction product causes increase of the resistance of the electrode, and increase of the current collapse. In other words, this reaction product deteriorates the electric performance characteristics of the semiconductor device.

When titanium and aluminum are adopted as principal materials of the metal film, the metal film may have a two-layered structure, comprising a lower layer mainly composed of a titanium and an upper layer mainly composed of aluminum. If so configured, the aluminum, which tends to react with the insulation film, can be disjoined from the insulation film. Therefore, to some extent, the generation of the reaction products, which leads to the deterioration of the electric performance characteristics of the semiconductor device, can be suppressed.

However, titanium and aluminum tend to diffuse to each other, and be mixed with each other. Therefore, even the mentioned layer-structured metal film formed of both metals cannot completely suppress the reaction between aluminum, contained in the metal film, and the silicon, etc., contained in the insulation film.

Accordingly, there is a demand for a semiconductor device in which the reaction between a metal, contained in the metal film and silicon, etc., contained in an insulation film, is suppressed, and the method for manufacturing the same. In the so structured semiconductor device, the increase of the resistance of an electrode and the increase of current collapse are suppressed; therefore, the semiconductor device has satisfactory electric performance characteristics.

SUMMARY OF THE INVENTION

The present invention is made in view of the above-stated circumstances. That is, the present invention seeks to provide a semiconductor device that prevents the generation of a reaction product of reaction between materials contained a metal film and a material contained in an insulation film to thereby provide a satisfactory electric performance characteristics. The present invention also aims at providing the method for manufacturing such a semiconductor device.

To achieve the above objective, a semiconductor device according to a first aspect of the present invention comprises a semiconductor layer; an insulation film formed on the semiconductor layer and having an opening formed thereon, an electrode formed on the insulation film in such a way as to fill the opening and containing at least aluminum, and a protective film formed on the interface between the insulation film and the electrode, and preventing aluminum contained in the electrode from diffusing into the insulation film.

The electrode may contain aluminum and titanium, and the protective film may be formed of a material such that a diffusion constant of aluminum with respect thereto is smaller than a diffusion constant of titanium with respect thereto.

The protective film may be formed of at least any one of Cr, W and Ta, or a metal oxide containing at least one of Cr, W and Ta. The insulation film may contain silicon. The semiconductor layer may comprise a nitride-based compound. To achieve the above objective, the method for manufacturing the semiconductor device according to the second aspect of the present invention comprises: a) forming a semiconductor layer on a semiconductor substrate; b) forming an insulation film on an upper surface of the semiconductor layer; c) forming, on a part of the insulation film, an opening reaching the semiconductor layer; d) forming a protective film on the opening and on a side of the opening; e) forming an electrode containing aluminum, in such a way as to be in contact with a part which exposes via the opening of the semiconductor layer, and come in contact with the protective film, f) heat treatment for allying the semiconductor layer with the electrode, wherein the protective film serves to prevent diffuse of aluminum into the insulation film, in step f). The insulation film may contain silicon. The protective film may be formed of a material having a melting point that is higher than 1650 degree. C.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENT

A semiconductor device according to the embodiments of the present invention and a method for manufacturing the same will be described with reference to the drawings.

Figure 1:
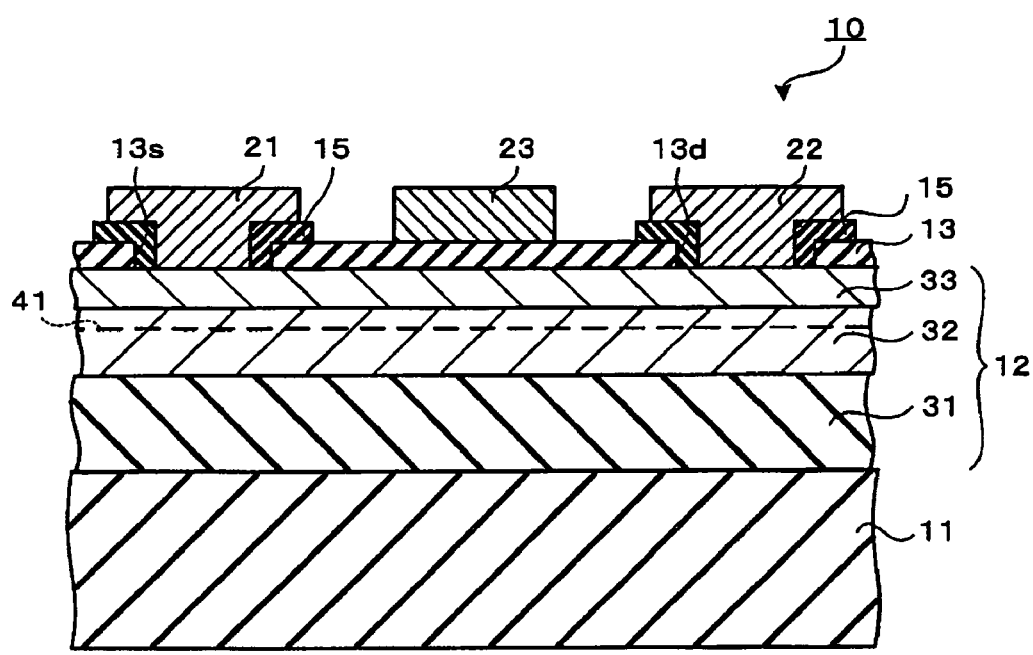
FIG. 1 is a cross-sectional view of an exemplary structure of a semiconductor device according to an embodiment of the present invention.

A semiconductor device 10 according to an embodiment of the present invention and a method for manufacturing the same are shown in FIGS. 1, 2A, 2B, 2C, 2D, and 2E. Here the description will be given with a High Electron Mobility Transistor (HEMT) taken as an example of the semiconductor device according to the embodiment. FIG. 1 is cross-sectional view showing an exemplary structure of the semiconductor device 10 according to the embodiment.

The semiconductor device 10, as shown in FIG. 1, comprises a substrate 11, a semiconductor layer 12, an insulation film 13, a protective film 15, a source electrode 21, a drain electrode 22 and a gate electrode 23.

The substrate 11 is formed of, for example, Si monocrystal. The substrate 11 serves as a substrate for growing the semiconductor layer 12 by epitaxy. The substrate 11 also serves to support the semiconductor layer 12, etc.

The semiconductor layer 12 is formed on the substrate 11 by, for example, epitaxial growth. The semiconductor layer 12 comprises a buffer region 31, an electron transit layer 32, and an electron supply layer 33.

The buffer region 31 is formed on the upper surface of the substrate 11. Although the buffer region 31 is depicted as a single layer in FIG. 1, it may have a multi-layered structure. The buffer region 31 is formed by Metal Organic Chemical Vapor Deposition (MOCVD), etc. The buffer region 31 have a multilayered structure in which, for example, a first sub layer formed of aluminum nitride (AlN) and a second sub layer formed of gallium nitride (GaN), are alternately laminated. The buffer region 31 can be substituted by any other of the Groups III-V compound semiconductors, instead of AlN and GaN. The buffer region may be a single layer. The buffer region 31 does not directly involved in the operation of the semiconductor device 10. Therefore, the buffer region 31 is omissible.

The electron transit layer 32 is formed of, for example, undoped GaN, which is a semiconductor to which no impurity is added, and formed on the buffer region 31. The thickness of the electron transit layer 32 is, for example, 1 to 3 μm.

The electron transit layer 32 is necessary for obtaining a two-dimensional electron gas layer (2DEG layer) 41 that serves as a current channel extending in parallel with a primary plane of the semiconductor layer 12 (In FIG. 1, the direction corresponding to the horizontal direction). This electron transit layer 32 can be formed of any other of Groups III-V compound semiconductors, instead of GaN.

The electron supply layer 33 is formed on the electron transit layer 32. The electron supply layer 33 is formed of a nitride-based compound semiconductor. The nitride-based compound semiconductor is, for example, undoped $Al_nGa_{1-n}N$ (n is a value that satisfies: $0 \leq n \leq 1$; n is preferably 0.2 to 0.4, and more preferably, 0.3). The band gap of a nitride-based compound semiconductor that constitutes an electron supply layer 33 is greater than that of the nitride-based compound semiconductor that constitute the electron transit layer 32 located under the layer. And, the lattice constant of the nitride-based compound semiconductor that constitutes the electron supply layer 33 is different from the lattice constant of the nitride-based compound semiconductor that constitutes the electron transit layer 32. Therefore, in accordance with a piezo polarization in a hetero-junction plane between the electron supply layer 33 and an electron transit layer 32, a 2DEG layer 41 is generated in the proximity to the electron supply layer 33 in the electron transit layer 32, as shown by a dotted line in FIG. 1. FIG. 1 shows the 2DEG layer 41, where there is an on state between the drain electrode 22 and the source electrode 21. The electron supply layer 33 has a thickness thinner than the electron transit layer 32. The thickness of the electron supply layer 33 is, for example, 20 nm or so. Therefore, the electron supply layer 33 has a negligibly small electric resistance in the vertical direction (vertical direction in FIG. 1) with respect to the primary plane of the semiconductor layer 12. On the other hand, the electron supply layer 33 has a larger electric resistance in the horizontal direction with respect to the primary plane of the semiconductor layer 12, as compared to the horizontal direction with respect to the primary plane (horizontal direction in FIG. 1). The thickness of electron supply layer 33 may suitably change within the range of, for example, 5 to 50 nm. As mentioned above, the electron supply layer 33 is composed of undoped $Al_nGa_{1-n}N$ in the present embodiment. The undoped $Al_nGa_{1-n}N$ has characteristics similar to n-type semiconductor. Therefore, instead of undoped $Al_nGa_{1-n}N$, $Al_nGa_{1-n}N$ may be used for the electron supply layer 33 wherein an n-type impurity is diffused.

The insulation film 13 is composed of an insulation material, e.g. $SiO_x$. The insulation film 13 is formed so as to cover the upper surface of the semiconductor layer. The insulation film 13 is formed by known CVD (Chemical Vapor Deposition). The insulation film 13 may be formed by oxidizing polysilicon. The insulation film 13 has openings 13s and 13d, in those parts that correspond to the source electrode 21 and the drain electrode 22 to be formed, as shown in FIG. 1. The insulation film 13 can be composed of SiNx, not limited to $SiO_x$. Or, the insulation film 13 may be composed of $SiO_x$ and $SiN_x$.

The protective film 15 is provided on the interface between the source electrode 21 and the insulation film 13. The protective film 15 is provided also on the interface between the drain electrode 22 and the insulation film 13. The protective film 15 is formed so as to cover the insulation film 13, which faces each of the drain electrode 22 and the source electrode 23. The protective film 15 is, preferably, formed so as to cover the upper and side faces of the insulation film 13, as shown in FIG. 1. The protective film 15 suppresses the diffusion of aluminum contained in the source electrode 21 and the drain electrode 22 from diffusing into the insulation film 13. Therefore, whatever material is applicable for the protective film 15 if it, by its nature, suppresses the diffusion of the aluminum into the insulation film 13.

As described later, the source electrode 21 and the drain electrode 22 in this embodiment has a multi-layered structure wherein an aluminum layer and a titanium layer are laminated. Therefore, the protective film 15 is composed of a material in which diffusion constant of aluminum is smaller than that of titanium. Examples of such materials are chromium (Cr), tungsten (W) and tantalum (Ta). Therefore preferably, the protective film 15 includes at least any one of Cr, W and Ta. Or, the protective film 15 may be composed of at least any one of metal oxides of Cr, W and Ta. Thus provided protective film 15 prevents the diffusion of aluminum into the insulation film 13. As a result, aluminum contained in the source electrode 21 and silicon, etc. contained in the insulation film 13 are prevented from reacting with each other. Likewise, aluminum contained in the drain electrode 22 and silicon, etc. contained in the insulation film 13 are prevented from reacting with each other. As a result, the generation of reaction product, e.g. AlSi, AlSiO, and $Al_2O_3$, etc. are suppressed. Particularly, when the protective film 15 contains a metal oxide, the diffusion of aluminum can be suppressed strongly; therefore it is preferable.

It is generally said that metal causes self surface diffusion at a temperature of about 1/10 of the melting point, and that alloying begins at a temperature of about 1/3 of the melting point, where the unit of temperature is degree. C. It is preferable that the melting point of the material making up the protective film 15 is as high as possible as compared to the temperature at which the nitride-based compound semiconductor making up the semiconductor layer 12 and the metal making up the source electrode 21 and the metal making up the drain electrode 22 are heat-treated and alloyed. As is described later in a greater detail, generally, a heat treatment process for alloying a nitride-based compound semiconductor with a metal is performed under the temperature of 550 degree. C. to 850 degree. C. If this fact is considered together with the above-mentioned alloying starting temperature of about 1/3 of the melting point, it leads to the following conclusion: the melting point of the material of the protective film 15 is, preferably, 1650(=550×3) degree. C. or greater.

The protective film 15 may be composed of a conductive material. If structured so, the protective film 15 works as a part of the current path. That is, the protective film 15 serves as a part of the source electrode 21, as well as serving as a part of the drain electrode 22.

The source electrode 21 is composed of a conductive material. The source electrode 21 is composed of, for example, an article wherein aluminum and titanium are layered. The source electrode 21 and an electron supply layer 33 of the semiconductor layer 12 come in ohmic contact with each other.

The drain electrode 22 is composed of a conductive material. The drain electrode 22 is, for example, an article wherein aluminum and titanium are layered. The drain electrode 22 and the electron supply layer 33 of the semiconductor layer 12 are in an ohmic contact with each other. The source electrode 21 and the drain electrode 22 are formed in a position to be opposed to each other across the gate electrode 23.

The gate electrode 23 is composed of a conductive material. The gate electrode 23 is composed of, for example, polysilicon wherein an impurity is diffused, and aluminum. The gate electrode 23 is formed on the insulation film 13.

As described above, in the semiconductor device 10 according to the present embodiment, the protective film 15 is formed in such a way as to cover at leas the upper surface of the insulation film 13. This is for preventing aluminum contained in the source electrode 21 and aluminum contained in the drain electrode 22 from diffusing into the insulation film 13. Thus formed protective film 15 can prevent the diffusion of aluminum into the insulation film 13. Therefore, the generation of reaction product, such as AlSi, AlSiO and $Al_2O_3$, of the reaction between aluminum and component contained in the insulation film 13 in the heat treatment can be prevented. Therefore, it becomes possible to prevent the increase of resistance of the electrode and the increase of current collapse. Therefore, the semiconductor device 10 according to the present embodiment has satisfactory electric performance characteristics.

Next, a method for manufacturing the semiconductor device 10 according to the embodiments of the present invention will be described with reference to the drawings.

Figure 2A:
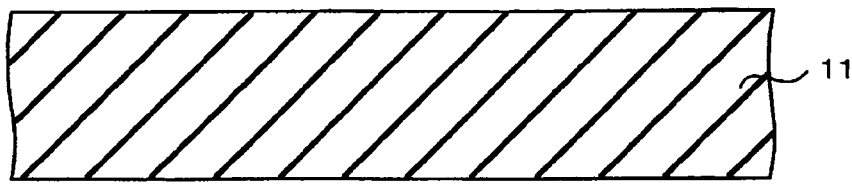
FIGS. 2A to 2E illustrate a method for manufacturing a semiconductor device according to the embodiment of the present invention.

First, as shown in FIG. 2A, a substrate 11 is prepared. The substrate 11 is composed of, for example, a silicon monocrystal substrate. On the upper surface of the substrate 11, a buffer region 31, an electron transit layer 32, and an electron supply layer 33 are formed by CVD (Chemical Vapor Deposition), etc.

Figure 2B:
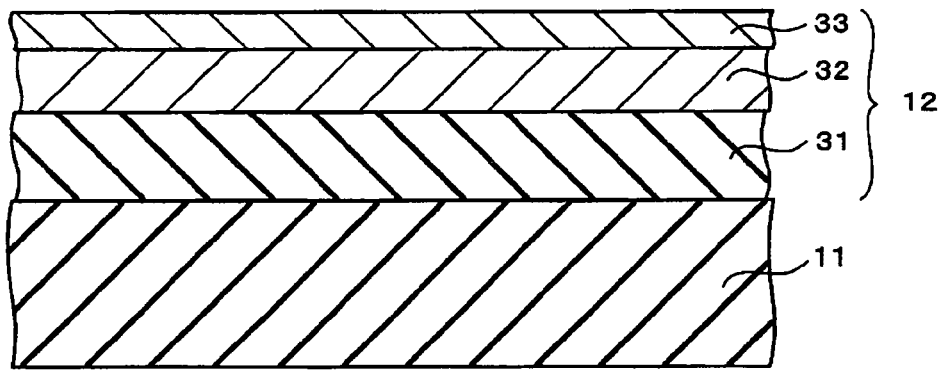
Figure 2C:
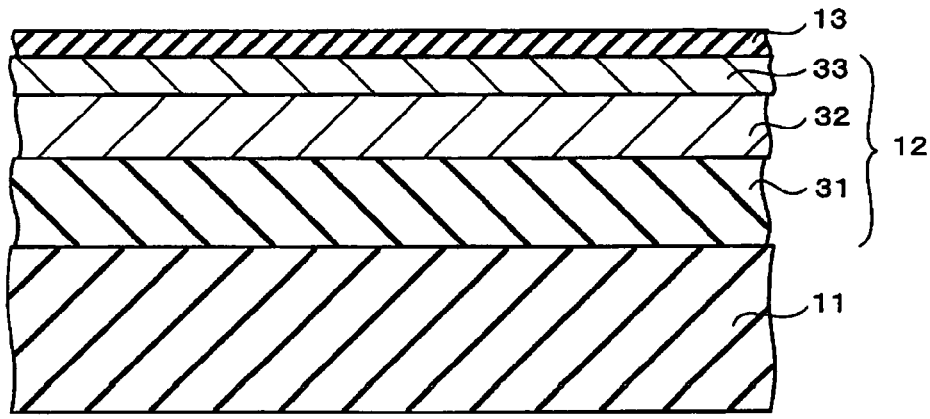

In this way, the semiconductor layer 12 is formed as shown in FIG. 2B. Then, on the upper surface of the semiconductor layer 12, an insulation film 13 composed of an insulating material is formed by CVD, etc., as shown in FIG. 2C. An example of such an insulating material is $SiO_x$. Then, by using photo lithography, etc., openings 13s and 13d are formed on those regions of the insulation film 13 on which to form the source electrode 21 and the drain electrode 22.

Figure 2D:
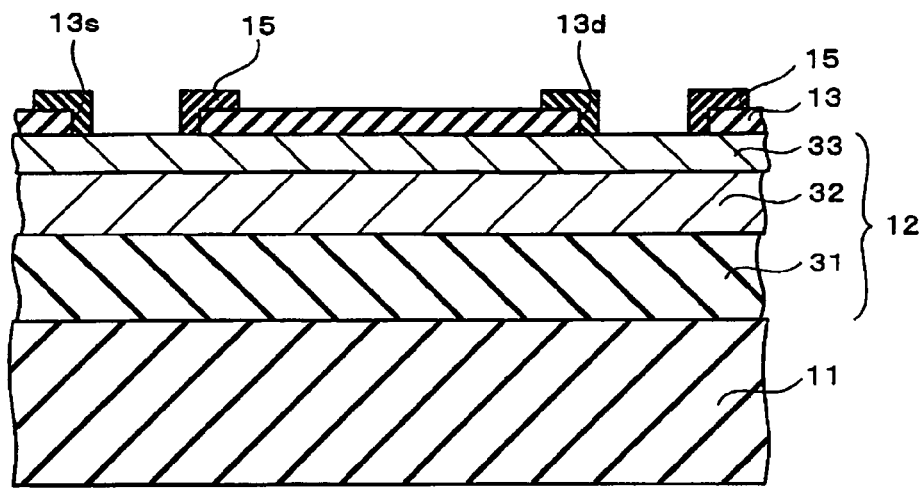

Next, a film composed of, for example at least any one of Cr, W and Ta are formed by Physical Vapor Deposition (PVD), etc. so as to cover those parts of the upper surface of the semiconductor layer 12, which are exposed via the opening 13s 13d, and the insulation film 13. The film may be composed of at least any one of metal oxides of Cr, W and Ta. Then, of the upper surface of the semiconductor layer 12, those parts on which to form the source electrode 21 and the drain electrode 22 are exposed. As a result, the protective film 15 is formed as shown in FIG. 2D.

The material of the protective film 15 is not limited to those indicated above. Whatever material is applicable for the protective film 15, if it, by its nature, prevents the diffusion of the aluminum contained in the source electrode 21 and the drain electrode 22 into the insulation film 13. In the present embodiment, the source electrode 21 and the drain electrode 22 are composed of the structure wherein aluminum and titanium are laminated as described later. The protective film 15 is composed of a material with respect to which the diffusion constant of aluminum is smaller than the diffusion constant of titanium. Preferably, the protective film 15 includes a metal oxide. Because, in such a structure the diffusion of aluminum into the insulation film 13 is strongly suppressed. It is also preferable to compose the protective film 15 of a conductive material. Because, in such a structure, the protective film 15 constitute a part of the current path, and as a result, the protective film 15 serves as a part of the electrode.

In this way, providing the protective film 15 prevents the diffusion of aluminum into the insulation film 13. Therefore, the reaction between aluminum contained in the source and drain electrodes 22 and 23, and Si, etc. contained in the insulation film 13 is prevented. Therefore, the generation of, for example, AlSi, AlSiO, $Al_2O_3$, etc. are prevented.

It is generally said that metal causes self surface diffusion at a temperature of about 1/10 of the melting point, and that alloying begins at a temperature of about 1/3 of the melting point, where the unit of the temperature is degree. C. The temperature of the melting point of the material making up the protective film 15 is preferably as high as possible as compared to the temperature at which the heat treatment, wherein the nitride-based compound semiconductor making up the semiconductor layer 12 are alloyed with the metal making up the source electrode 21 and the metal making up the drain electrode 22. Generally, a heat treatment for alloying the nitride-based compound semiconductor with a metal is performed at a temperature in the range of 550 degree. C. to 850 degree. C. If this fact is considered together with the above-mentioned alloying starting temperature of about ⅓ of the melting point, it leads to the following conclusion: the melting point of the material of the protective film 15 is, preferably, 1650 (=550×3) degree. C. or greater.

Next, a metal film is formed by PVD, etc. so as to cover those parts of the upper surface of the semiconductor layer 12, which are exposed via the opening 13s 13d, and the protective film 15. Then, the metal film is processed to thereby form the source electrode 21 and the drain electrode 22.

Then heat treatment is performed to thereby alloying the semiconductor layer 12 with the source electrode 21. Similarly, the semiconductor layer 12 and drain electrode 22 are alloyed with each other. The heat treatment is performed at a temperature in the range of, e.g. 550 degree. C. to 850 degree. C. The protective film 15 is, as described above, composed of a material that prevents diffusion of aluminum. Therefore, aluminum contained in the source electrode 21 and the drain electrode 22 are prevented from diffusing into the insulation film 13 via the protective film 15. The protective film 15 is preferably composed of a material that has a melting point three times the higher than the temperature at which the heat treatment is performed in the heat treatment process. If so configured, it prevents the protective film 15 itself from alloying. Moreover, such configuration satisfactorily prevents the alloying between the source electrode 21 and the insulation film 13, and allowing between the drain electrode 22 and the insulation film 13.

Figure 2E:
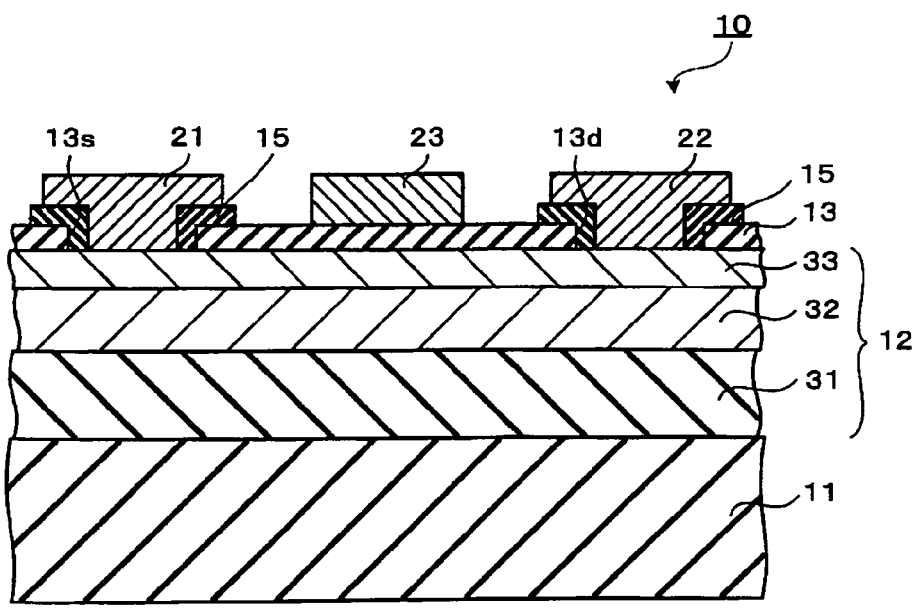

Next, a gate electrode 23 made up of, for example polysilicon, is formed on the insulation film 13 by CVD, etc. The above manufacturing steps yields a semiconductor device 10 as shown in FIG. 2E.

According to the method for manufacturing semiconductor device in accordance with the present embodiment, protective film 15 made up of a material that prevents the diffusion of aluminum is used. And the protective film is formed in such a way as to cover at least the upper surface of the insulation film 13. If so configured, the reaction between the aluminum contained in the source electrode 21 and the drain electrode 22, and Si, etc. contained in the insulation film 13 can be prevented. This suppresses increase of the resistance of the electrode and increase of current collapse. Therefore, according to the manufacturing method according to the present embodiment, a semiconductor device having a satisfactory electric performance characteristics can be manufactured.

According to the present embodiment, the protective film is formed in such a way as to cover at least the upper surface of the insulation film. This affords prevention of the reaction between the materials contained in the metal film and the material contained in the insulation film. Therefore, according to the present invention, a semiconductor device having a satisfactory electric performance characteristics, and the method for manufacturing the same, are provided.

Figure 3:
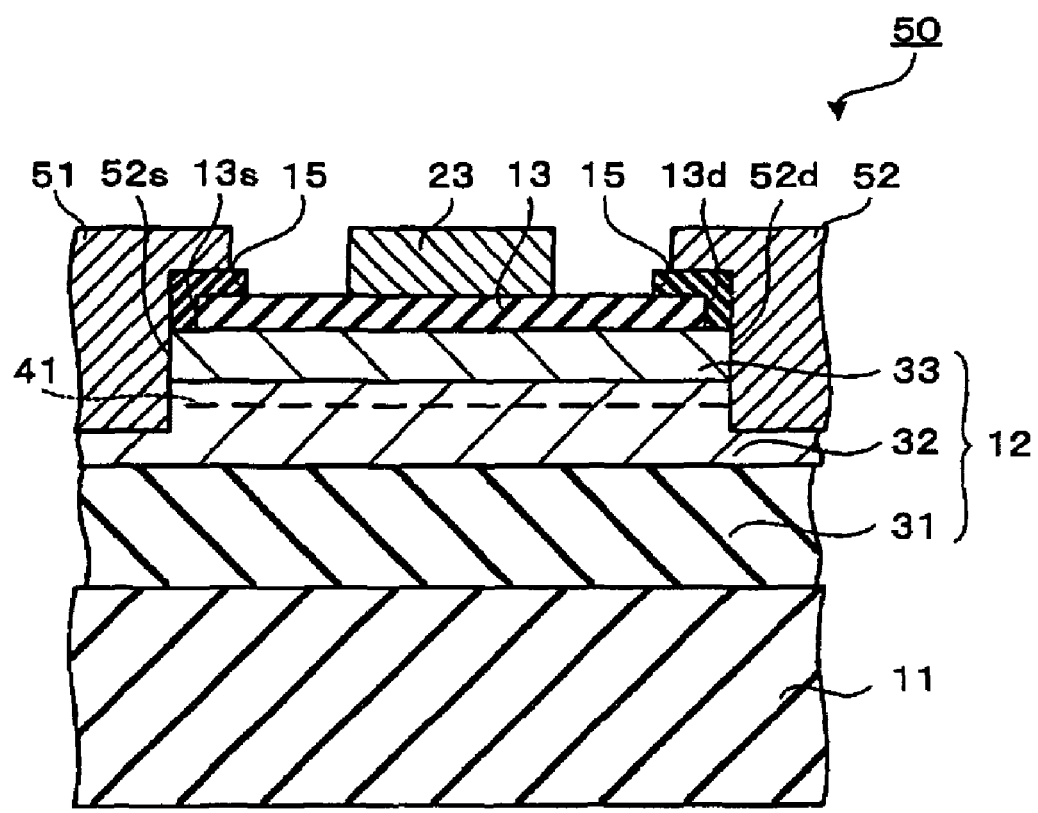
FIG. 3 is a cross-sectional view of an exemplary structure of a semiconductor device according to a modification of the present invention.

The invention is not limited to the above-described embodiment, and can be modified and applied in various other forms. One such modification is shown in FIG. 3. In the above-described embodiments, the source electrode 21 and the drain electrode 22 are described to be formed on the upper surface of the semiconductor layer 12, by way of example. However, the source electrode 21 and the drain electrode 22 are not necessarily formed in such a manner. A possible example of manner of forming the electrodes is shown as the semiconductor device 50 in FIG. 3. That is, on the upper surface of the semiconductor layer 12, recesses 52s and 52d reaching the hetero-junction plane (an interface between the electron transit layer 32 and the electron supply layer 33) are formed. Then, the source electrode 51 and the drain electrode 52 may be formed in such a way as to fill the recesses 52s and 52d, respectively. Thus formed source electrode 51 and drain electrode 52 enable reducing the resistance of the semiconductor device.

For improving the adherence between the protective film 15 with the insulation film 13, a thin film may be formed between the protective film 15 and the insulation film 13. Similarly, for improving the adherence between the protective film 15 and the source electrode 21, a thin film may be formed between the protective film 15 and the source electrode 21. In the same way, a thin film may be formed between the protective film 15 and the drain electrode 22 for improving the adherence therebetween.

The semiconductor layer 12 may be made up of, besides GaN and AlGaN, InGaN, AlInGaN, AlN, InAlN, AlP, GaP, AlInP, GaInP, AlGaP, AlGaAs, GaAs, AlAs, InAs, InP, InN and GaAsP, etc.

The substrate 11 is not limited to the silicon monocrystal substrate. The substrate 11 may be composed of another semiconductor, such as SiC, sapphire and ceramics, etc. The substrate 11 may be formed of an insulator.

Figure 4:
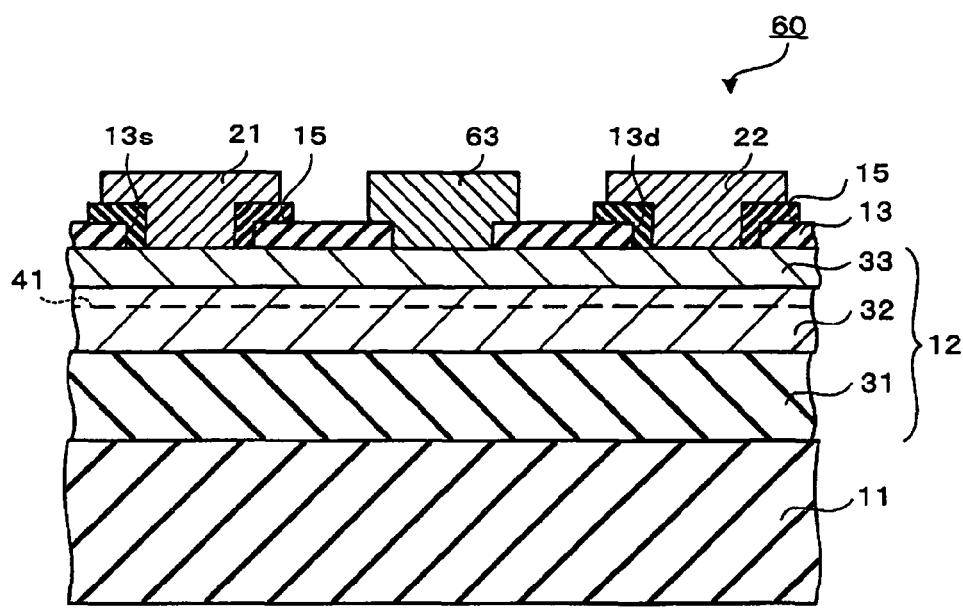
FIG. 4 is a cross-sectional view of an exemplary structure of a semiconductor device according to another modification of the present invention.

The above-described embodiment is explained with HEMT taken as an example of semiconductor devices. However, the present invention is generally applicable to any semiconductor device comprising aluminum-containing electrode. Examples of such semiconductor devices are Metal Semiconductor Field Effect Transistor (MESFET) and diode. Additionally, in the above-described embodiment, the gate electrode 23 was a part of MIS structure, as a result of being formed on the insulation film 13, as shown in FIG. 1 The present invention is not limited to this structure. For example, one possible modification is shown as a semiconductor device 60 in FIG. 4, wherein the gate electrode 63 is formed directly on the semiconductor layer 12, consequently making the gate electrode 63 of Schottky structure.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

What is claimed is:

1. A semiconductor device comprising:
   a semiconductor layer composed of a nitride-based compound, which comprises a hetero-junction structure;
   an insulation film formed on the semiconductor layer and having an opening formed thereon;
   at least one recess which reaches the hetero-junction structure from an upper surface of the semiconductor layer; and
   an electrode, which functions as an ohmic electrode, is formed on the insulation film in such a way as to fill the opening and the recess and comprises at least aluminum, and wherein the electrode comes in ohmic contact with the semiconductor layer at the hetero-junction structure; and a protective film formed on the interface between the insulation film and the electrode, and preventing aluminum contained in the electrode from diffusing into the insulation film.

2. The semiconductor device according to claim 1, wherein the electrode contains aluminum and titanium, and the protective film is formed of a material such that a diffusion constant of aluminum with respect thereto is smaller than a diffusion constant of titanium with respect thereto.

3. The semiconductor device according to claim 2, wherein the protective film is formed of at least any one of Cr, W and Ta, or a metal oxide containing at least one of Cr, W and Ta.

4. The semiconductor device according to claim 3, wherein the insulation film contains silicon.

5. The semiconductor device according to claim 2, wherein the insulation film contains silicon.

6. The semiconductor device according to claim 1, wherein the protective film is formed of at least any one of Cr, W and Ta, or a metal oxide containing at least one of Cr, W and Ta.

7. The semiconductor device according to claim 6, wherein the insulation film contains silicon.

8. The semiconductor device according to claim 1, wherein the insulation film contains silicon.

9. The semiconductor device according to claim 1, wherein the semiconductor layer comprises:

an electron transit layer which forms the hetero-junction structure; and an electron supply layer formed on the electron transit layer and is exposed from upper surface of the semiconductor layer; and wherein the electrode is disposed adjacent to the electron transit layer and in ohmic contact with the electron transit layer.

* * * * *